(12) United States Patent
Choi et al.

(10) Patent No.: US 6,921,705 B2
(45) Date of Patent: Jul. 26, 2005

(54) METHOD FOR FORMING ISOLATION LAYER OF SEMICONDUCTOR DEVICE

(75) Inventors: Myung Gyu Choi, Chungcheongbuk-do (KR); Hyung Sik Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 34 days.

(21) Appl. No.: 10/744,427

(22) Filed: Dec. 22, 2003

(65) Prior Publication Data

US 2005/0009292 A1 Jan. 13, 2005

(30) Foreign Application Priority Data

Jul. 9, 2003 (KR) .................... 10-2003-0046350

(51) Int. Cl.[7] .................................................. H01L 21/76
(52) U.S. Cl. .................... 438/424; 438/433; 438/435; 438/437; 438/447; 438/524; 438/525; 438/714; 438/739
(58) Field of Search ................. 438/424, 433, 438/435, 437, 440, 447, 524–525, 714, 739

(56) References Cited

U.S. PATENT DOCUMENTS

| | | | | |
|---|---|---|---|---|
| 4,653,177 A | * | 3/1987 | Lebowitz et al. | 438/433 |
| 5,498,564 A | * | 3/1996 | Geissler et al. | 438/247 |
| 5,795,801 A | * | 8/1998 | Lee | 438/199 |
| 5,915,195 A | * | 6/1999 | Fulford et al. | 438/524 |
| 5,940,718 A | * | 8/1999 | Ibok et al. | 438/440 |
| 5,943,589 A | * | 8/1999 | Ogushi | 438/407 |
| 5,960,276 A | * | 9/1999 | Liaw et al. | 438/224 |
| 6,030,882 A | | 2/2000 | Hong | 438/433 |
| 6,030,898 A | * | 2/2000 | Liu | 438/692 |
| 6,150,237 A | * | 11/2000 | Lee | 438/433 |
| 6,284,626 B1 | * | 9/2001 | Kim | 438/433 |
| 6,309,949 B1 | * | 10/2001 | He et al. | 438/424 |
| 6,323,106 B1 | * | 11/2001 | Huang et al. | 438/433 |
| 6,432,797 B1 | | 8/2002 | Cha et al. | 438/424 |
| 6,548,372 B1 | * | 4/2003 | Mouli | 438/424 |
| 6,576,558 B1 | | 6/2003 | Lin et al. | 438/700 |
| 6,624,016 B2 | * | 9/2003 | Wu | 438/221 |
| 6,746,936 B1 | * | 6/2004 | Lee | 438/445 |
| 6,780,730 B2 | * | 8/2004 | Lin | 438/424 |
| 6,806,163 B2 | * | 10/2004 | Wu et al. | 438/423 |
| 2002/0182826 A1 | * | 12/2002 | Cheng et al. | 438/433 |
| 2004/0014296 A1 | * | 1/2004 | Kwak et al. | 438/424 |
| 2004/0110358 A1 | * | 6/2004 | Lee | 438/437 |
| 2005/0012173 A1 | * | 1/2005 | Sheu et al. | 257/519 |

* cited by examiner

*Primary Examiner*—Mary Wilczewski
*Assistant Examiner*—Toniae M. Thomas
(74) *Attorney, Agent, or Firm*—Ladas & Parry LLP

(57) ABSTRACT

A method for forming an isolation layer of a semiconductor device. The method includes: a) sequentially laminating a pad oxide layer and pad nitride layer on a semiconductor substrate; b) selectively removing the pad nitride layer, selectively removing the pad oxide layer and the substrate, thereby forming a trench in the substrate; c) implanting ions in a direction with a tilted angle into a side wall of the pad nitride layer located in an upper side of the trench; d) removing the side wall portion of the pad nitride layer in the trench, in which the ions are implanted, to form a sloped side wall of the pad nitride layer, wherein the sloped side wall is inclined in an inverse direction; e) filling a HDP oxid layer in an upper surface of an entire structure including the trench; f) planarizing the HDP oxide layer and the pad nitride layer; and g) removing a remaining pad nitride layer, thereby forming an isolation layer.

4 Claims, 7 Drawing Sheets

METHOD FOR FORMING ISOLATION LAYER OF SEMICONDUCTOR DEVICE

BACKGROUND OF THE INVENTION

1. Field of the Invention

The present invention relates to a method for forming an isolation layer of a semiconductor device, and more particularly to a method for forming an isolation layer of a semiconductor device capable of forming a field oxide layer having a shape of a bell, which can reduce a moat in an STI edge portion.

2. Description of the Prior Art

A shallow trench isolation (hereinafter, referred to as an STI) method has been used as an element isolation method until now.

An isolation layer formation method using this STI method will be described with reference to FIG. 1.

FIGS. 1a to 1e are cross-sectional views according to steps in a method of forming an isolation layer of a semiconductor device according to the prior art.

In the conventional method of forming an isolation layer as shown in FIG. 1a, a pad oxide layer 13 and a pad nitride layer 15 are laminated on a semiconductor substrate 11, and photoresist is coated on the pad nitride layer 15. Then, the lamination of the pad nitride layer 15, the pad oxide layer 13 and the photoresist is exposed to light and developed by photolithography, and is then selectively patterned to form a photosensitive film pattern 17 for a trench mask.

Next, as shown in FIG. 1b, the pad nitride layer 15 is etched using the photosensitive layer pattern 17 as a mask, and the pad oxide layer 13 and the substrate 11 are sequentially removed, so that a trench (not shown) for element isolation is formed. Next, in order to improve interfacial characteristic with an oxide layer, a linear oxide layer 19, which is a thermal oxide layer, is grown on a surface of the trench (not shown), so that an STI edge portion is rounded.

Next, as shown in FIG. 1c, a HDP oxide layer 21 is deposited on an upper surface of an entire structure including the trench (not shown) to fill the trench with the HDP oxide layer 21.

Next, as shown in FIG. 1d, the HDP oxide layer 21 is selectively removed by the CMP process, using the pad nitride layer 15 as an etching end point.

Next, as shown in FIG. 1e, the remaining pad nitride layer 15 is removed by a wet etching to form a trench isolation layer 21a, and a well formation and a threshold voltage ion implantation are performed, so that a gate oxide layer (not shown) is grown. Herein, in some cases, before ion implantation for a well formation after the pad nitride layer is removed, an oxide layer may be grown as a buffer layer for ion implantation.

Further, a field oxide layer is etched by cleaning solution through such a series of steps as described above. Herein, the field oxide layer of the STI edge portion is recessed downward. The shape of the recessed portion is called a moat.

When a moat occurs, silicon in the STI edge (i.e. silicon in an edge of an active area) is exposed, and the exposed portion may be thinned during growth of a gate oxide layer. Further, a gate electrode is formed to the moat portion, and therefore a voltage may be concentrated on the edge portion.

These phenomena cause a threshold voltage of a transistor to change, and therefore the transistor may operate at a lower voltage than a desired threshold voltage.

In order to solve theses problems, a front edge of the nitride layer, which is used as a mask for forming an STI pattern, may be retreated to an active area by means of phosphoric acid solution.

However, since this method uses the phosphoric acid more than 140°, it is difficult to maintain constant etch rate. Further, since a great deal of phosphoric acid is used, it is not preferable from an environmental standpoint.

Furthermore, since the silicon is exposed to a high temperature phosphoric acid solution, the silicon wafer may be damaged.

SUMMARY OF THE INVENTION

Accordingly, the present invention has been made to solve the above-mentioned problems occurring in the prior art, and it is an object of the present invention to provide a method for forming isolation layer of a semiconductor device, which can improve the reliability and the electrical characteristic of the device by reducing a parasitic leakage, deterioration of gate oxide integrity (GOI), an inverse narrow width effect (INWE), and a subthreshold hump phenomenon, etc., which may be caused by a structure having a moat and a peaked upper corner portion of a trench during forming the isolation layer.

In order to achieve the above objects, according to one aspect of the present invention there is provided a method for forming an isolation layer of a semiconductor device comprising the steps of: a) sequentially laminating a pad oxide layer and pad nitride layer on a semiconductor substrate; b) selectively removing the pad nitride layer, selectively removing the pad oxide layer and the semiconductor substrate, thereby forming a trench in the semiconductor substrate; c) implanting ions in a direction with a tilted angle into a side wall of the pad nitride layer located in an upper side of the trench; d) removing the side wall portion of the pad nitride layer in the trench, in which the ions are implanted, to form a sloped side wall of the pad nitride layer, wherein the sloped side wall is, inclined in an inverse direction; e) filling a HDP oxide layer in an upper surface of an entire structure including the trench; f) planarizing the HDP oxide layer and the pad nitride layer; and g) removing a remaining pad nitride layer, thereby forming an isolation layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

FIGS. 2a to 2j are cross-sectional views according to steps in a method of forming an isolation layer of a semiconductor device according to the present invention.

Figure 1A:
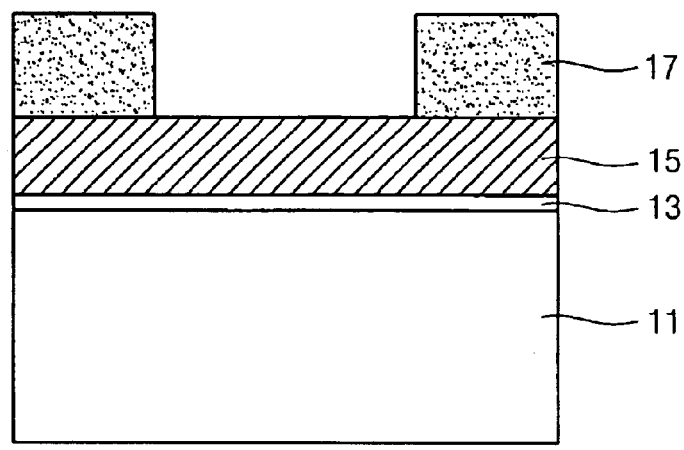
FIGS. 1a to 1e are cross-sectional views according to steps in a method of forming an isolation layer of a semiconductor device according to the prior art.
Figure 1B:
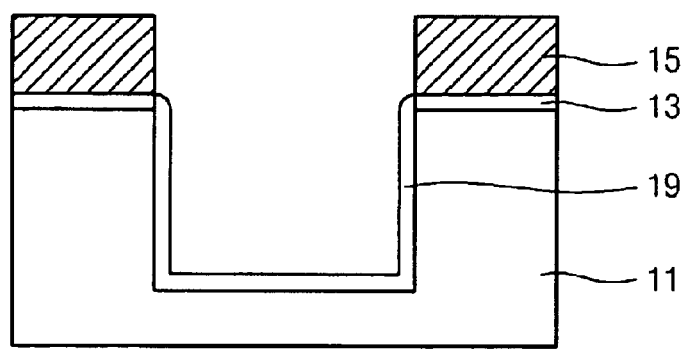
Figure 1C:
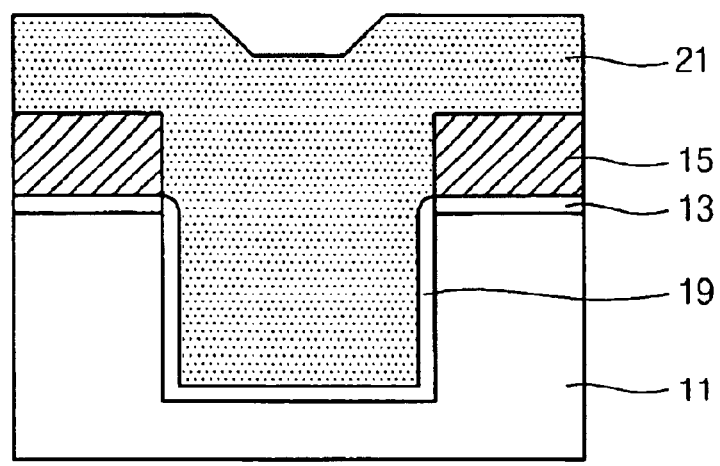
Figure 1D:
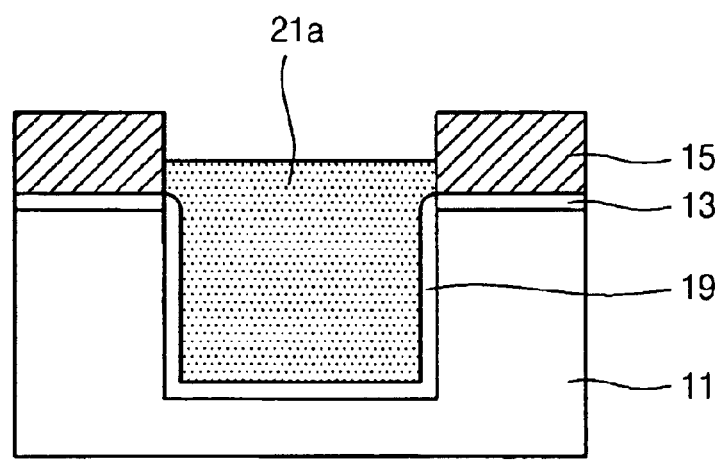
Figure 1E:
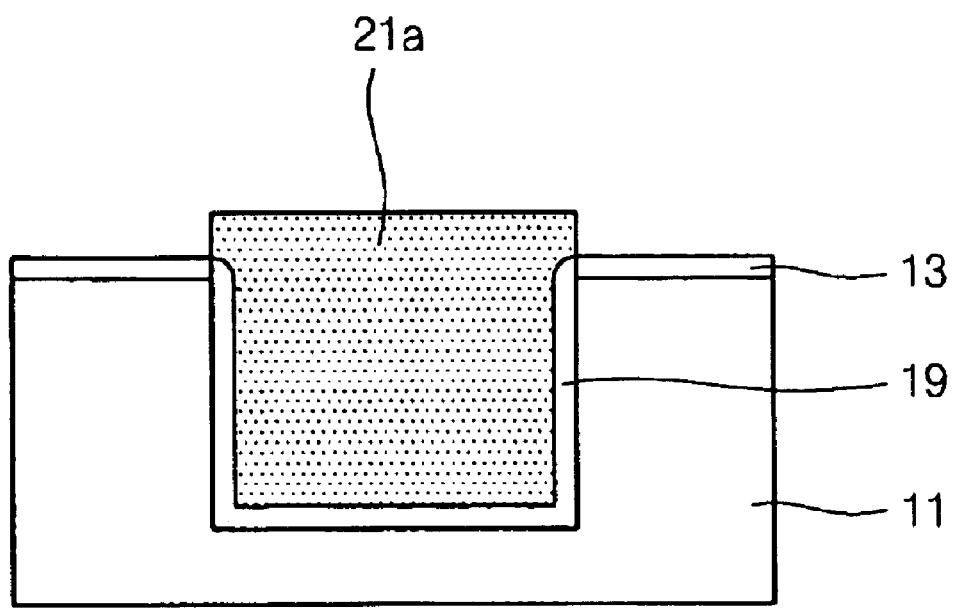
Figure 2A:
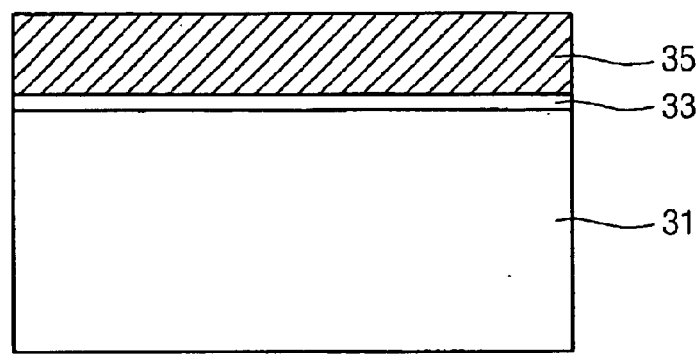
FIGS. 2a to 2j are cross-sectional views according to steps in a method of forming an isolation layer of a semiconductor device according to the present invention.

In the isolation layer formation method of a semiconductor device according to the present invention as shown in FIG. 2a, a pad oxide layer 33, which is a surface oxide layer, and a pad nitride layer 35 are laminated on a semiconductor substrate 31. Herein, the pad oxide layer 33 is used for alleviating stress between the semiconductor substrate 31 and the pad nitride layer 35. Further, the pad nitride layer 35 is used as an etching stopping layer in an STI CMP process, and it is also used as a hard mask in an STI etching.

Figure 2B:
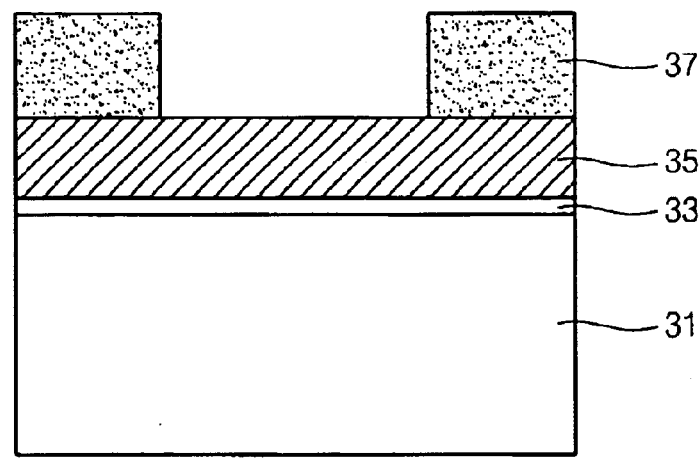

Next, as shown in FIG. 2b, photoresist is coated on the pad nitride layer 35. The lamination of the pad oxide layer 33, the pad nitride layer 35, and the photoresist is exposed to light and developed by a photolithography process, and is then selectively patterned to form a photosensitive layer pattern 37 for trench mask which divides an active area and a field area of an element.

Figure 2C:
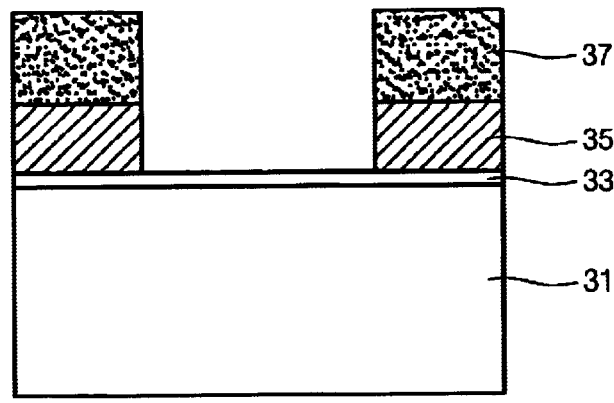

Next, in a first STI etching process as shown in FIG. 2c, the pad nitride layer 35, which is located in an area defined as a field area, is etched using the photosensitive layer pattern 37 as a mask.

Figure 2D:
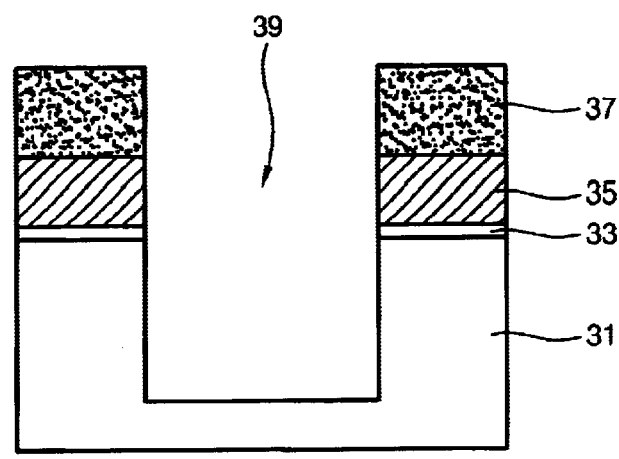

Next, as shown in FIG. 2d, the pad nitride layer 35 is used as a hard mask to etch the pad oxide layer 33 and the semiconductor substrate 31 by a predetermined depth from a silicon surface and to form a trench 39.

Figure 2E:
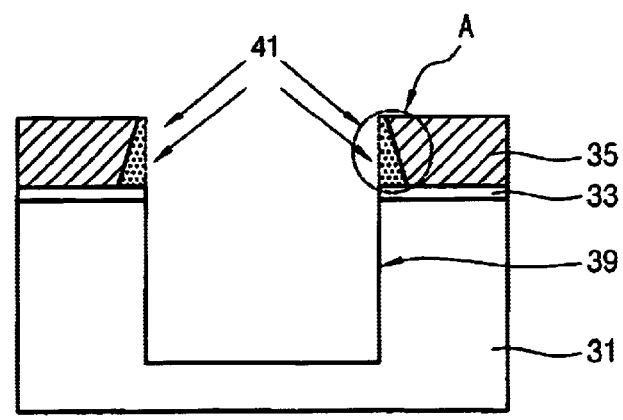

Next, in a second STI etching process as shown in FIG. 2e, the photosensitive layer pattern 37 is removed, and an ion implantation 41 is performed in a direction with an angle more than 0°. Herein, since the width of the pad nitride layer 35 retreating to an active area varies according to the angle of the ion implantation, a shape of a bell formed in the process also varies. Further, as it goes in the direction of the pad oxidation, the amount of ion implantation in a side wall of the pad nitride layer 35 increases.

Figure 2F:
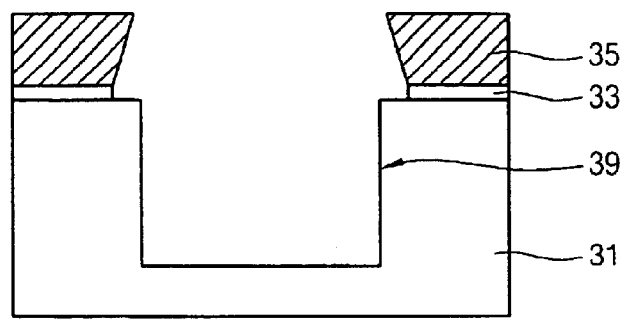

Next, as shown in FIG. 2f, a clean process is performed in HF series solution for a predetermined time to remove a portion in which the ion is implanted. Therefore, a shape of a bell, that is, a profile inclined to an inverse direction is formed.

Figure 2G:
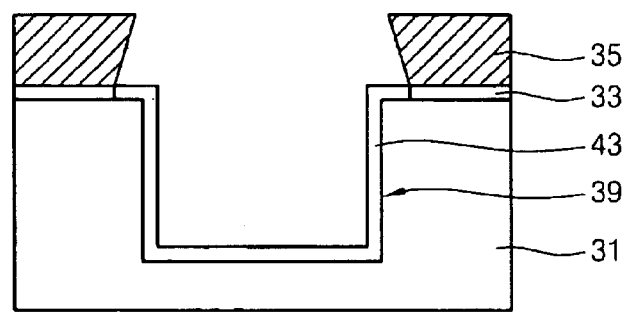

Next, as shown in FIG. 2g, a linear oxide layer 43, which is a thermal oxide layer, is grown on the surface of the trench 39.

Figure 2H:
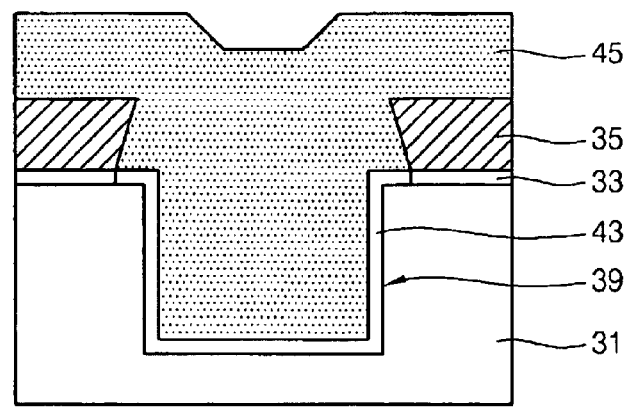

Next, as shown in FIG. 2h, an HDP oxide layer 45 is filled in an upper surface of the entire structure, including the trench 39, to fill the trench 39. Herein, an annealing process may be performed after the HDP oxide layer 45 is formed.

Figure 2I:
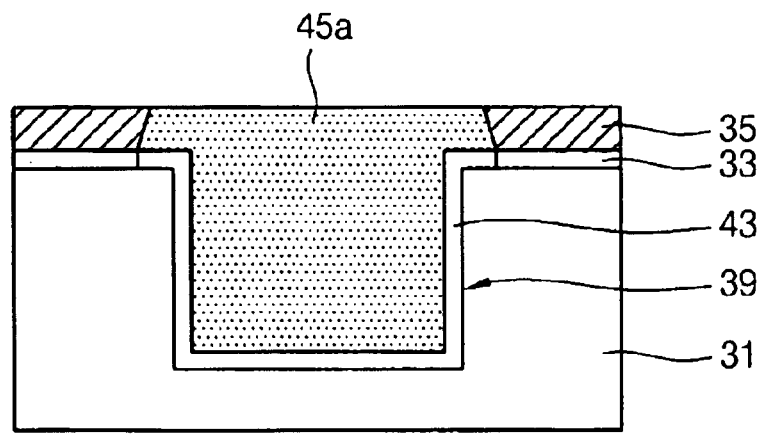

Next as shown in FIG. 2i, the HDP oxide layer 45 and the pad nitride layer 35 are planarized through a CMP process to a predetermined depth.

Figure 2J:
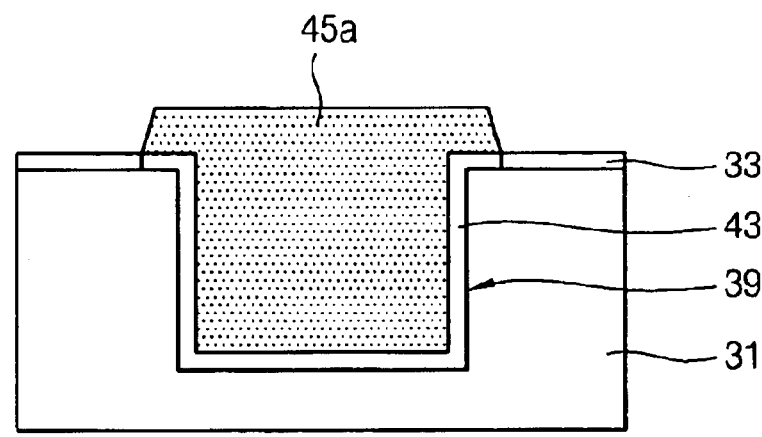

Next, as shown in FIG. 2j, the remaining pad nitride layer 35 is removed to form a round-shaped isolation layer 45a, and a predetermined portion of which goes into an active area.

Further, a field oxide layer is etched through the following cleaning process, but a moat cannot be prevented from being formed due to oxide layers formed in the active area.

As described above, in the method for forming isolation layer of the semiconductor device according to the present invention, the field oxide layer forms the moat in the STI upper corner portion point, in which the active area and the field area meet each other, through the subsequent cleaning process of the isolation layer process (i.e. a cleaning process before a gate oxide layer is formed and the subsequent cleaning process) and the subsequent oxide layer etching process. Herein, the nitride layer is etched in a step prior to the advance HDP deposition process by a field thickness in a side surface direction recessed in a process after the nitride layer removal process, so that the moat is removed in such a manner that depth recessed in the following cleaning process is compensated. Further, the method can round a structure, which has a peaked upper corner portion of a trench, by means of an increase in oxidation speed in the recessed active area.

Accordingly, the method can improve the reliability and the electrical characteristic of the device by reducing a parastic leakage, deterioration of gate oxide integrity (GOI), an inverse narrow width effect (INWE), and a subthreshold hump phenomenon, etc., which may be caused by a structure having a moat and a peaked upper corner portion of a trench.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A method for forming an isolation layer of a semiconductor device, the method comprising the steps of:

a) sequentially laminating a pad oxide layer and a pad nitride layer on a semiconductor substrate;

b) selectively removing the pad nitride layer, selectively removing the pad oxide layer and the semiconductor substrate, thereby forming a trench in the semiconductor substrate;

c) implanting ions in a direction with a tilted angle into a side wall of the pad nitride layer located in an upper side of the trench;

d) removing the side wall portion of the pad nitride layer in the trench, in which the ions are implanted, to form a sloped side wall of the pad nitride layer, wherein the sloped side wall is inclined in an inverse direction;

e) filling a HDP oxide layer in an upper surface of an entire structure including the trench;

f) planarizing the HDP oxide layer and the pad nitride layer; and g) removing a remaining pad nitride layer, thereby forming an isolation layer.

2. The method as claimed in claim 1, in step c, the ion implantations are performed in a direction with a tilted angle more than 0°.

3. The method as claimed in claim 1, wherein step d is performed through a cleaning process using HF-series solution.

4. The method as claimed in claim 1, wherein the amount of ion implantation in the side wall of the pad nitride layer 35 increases as it goes in a direction of the pad oxidation.

* * * * *